(12) United States Patent
Fitzpatrick et al.

(10) Patent No.: US 11,897,395 B2
(45) Date of Patent: Feb. 13, 2024

(54) VEHICLE SEAT WITH SELF-ADJUSTING DISPLAY

(71) Applicant: Faurecia Automotive Seating, LLC, Auburn Hills, MI (US)

(72) Inventors: Robert Fitzpatrick, Holland, MI (US); Jeffery Bonk, Chesterfield, MI (US); James Farber, Holland, MI (US); Todd Sieting, Clarkston, MI (US)

(73) Assignee: Faurecia Automotive Seating, LLC, Auburn Hills, MI (US)

( * ) Notice: Subject to any disclaimer, the term of this patent is extended or adjusted under 35 U.S.C. 154(b) by 326 days.

(21) Appl. No.: 17/306,757

(22) Filed: May 3, 2021

(65) Prior Publication Data

US 2022/0348148 A1 Nov. 3, 2022

(51) Int. Cl.
| | | |
|---|---|---|
| *B60R 11/02* | (2006.01) | |
| *B60N 2/20* | (2006.01) | |
| *G01C 9/06* | (2006.01) | |
| *H05K 5/00* | (2006.01) | |
| *B60R 11/00* | (2006.01) | |

(52) U.S. Cl.
CPC ............ *B60R 11/0235* (2013.01); *B60N 2/20* (2013.01); *G01C 9/06* (2013.01); *H05K 5/0017* (2013.01); *B60R 2011/0015* (2013.01); *B60R 2011/0017* (2013.01); *B60R 2011/0085* (2013.01); *B60R 2011/0092* (2013.01)

(58) Field of Classification Search
None
See application file for complete search history.

(56) References Cited

U.S. PATENT DOCUMENTS

| | | | |
|---|---|---|---|
| 8,308,237 B2 * | 11/2012 | Kunou | ................ B60R 11/0235 |
| | | | 297/217.3 |
| 8,934,063 B2 | 1/2015 | Boyer, Jr. | |
| 9,395,752 B2 | 7/2016 | Chen | |
| 9,990,006 B2 | 6/2018 | Sprenger et al. | |
| 10,315,766 B2 * | 6/2019 | Yokota | ............. B64D 11/00152 |
| 10,737,634 B2 * | 8/2020 | Lecomte | .......... B64D 11/00151 |
| 2007/0289099 A1 | 12/2007 | Jung | |
| 2016/0159481 A1 * | 6/2016 | Gianakopoulos | .. B64D 11/0015 |
| | | | 297/217.3 |
| 2017/0305359 A1 * | 10/2017 | Rook | ....................... B60R 11/02 |
| 2018/0229845 A1 * | 8/2018 | Yokota | ............. B64D 11/00151 |

FOREIGN PATENT DOCUMENTS

| | | |
|---|---|---|
| CN | 204336911 U | 5/2015 |
| KR | 20040078512 A | 9/2004 |
| WO | 2011016093 A1 | 2/2011 |

* cited by examiner

*Primary Examiner* — Xanthia C Relford
(74) *Attorney, Agent, or Firm* — Reising Ethington P.C.

(57) ABSTRACT

A vehicle seat is equipped with a display mounted on a reclinable seat back. The display self-adjusts to maintain a desired viewing angle when the recline angle of the seat back changes. The display is selectively locked or unlocked with respect to the seat back to move about a pivot axis. When a change in the recline angle is detected, the display is unlocked until the desired viewing angle is reestablished. Display movement relative to the seat can be damped rotational movement or motorized movement. A user can interact with the display to set or change the desired viewing angle.

20 Claims, 4 Drawing Sheets

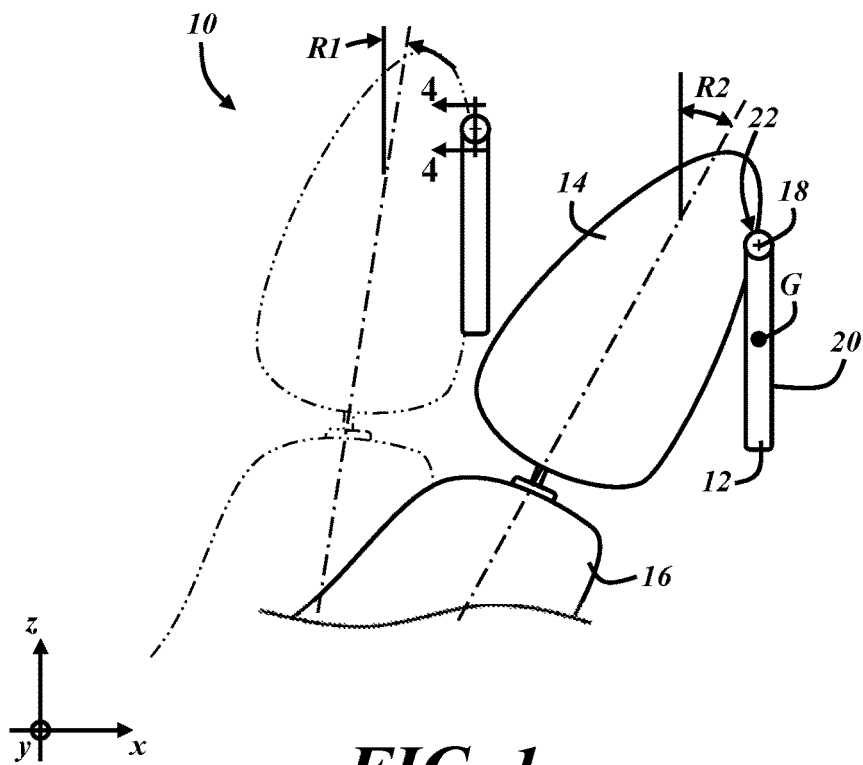
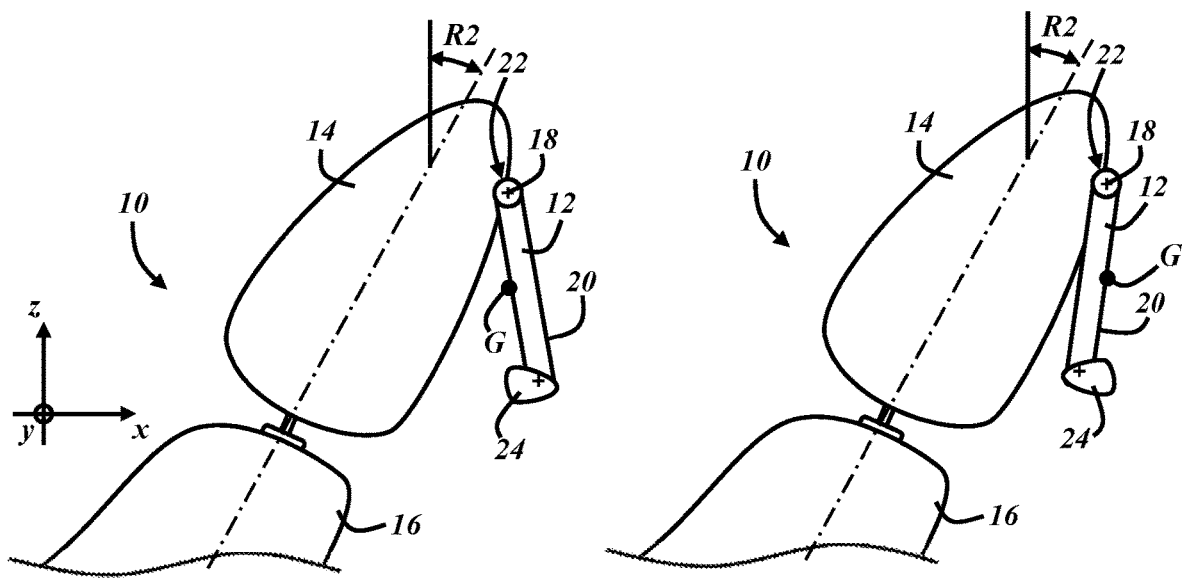
FIG. 1
FIG. 2
FIG. 3

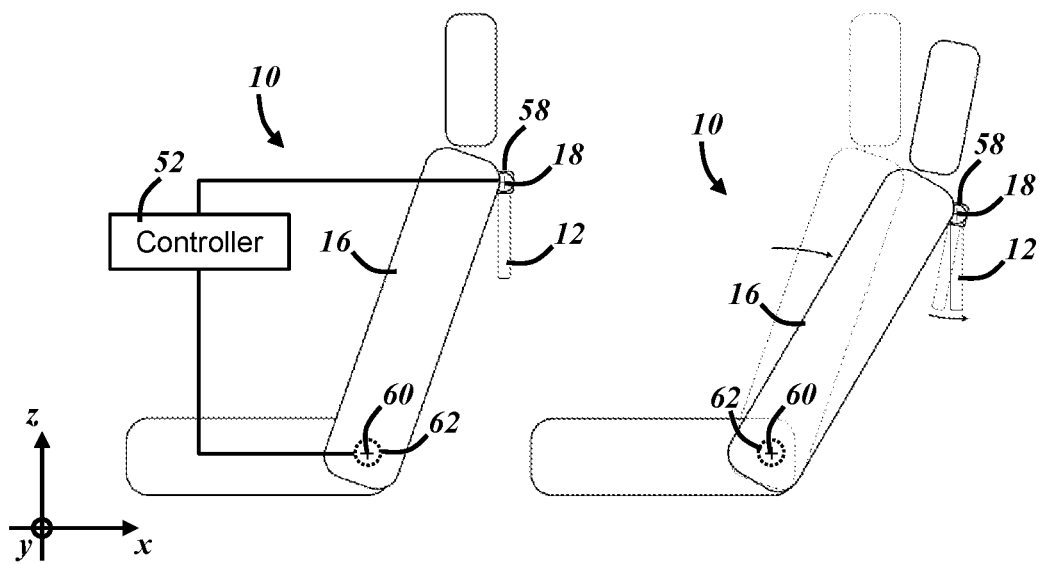
FIG. 9  FIG. 10

VEHICLE SEAT WITH SELF-ADJUSTING DISPLAY

TECHNICAL FIELD

The present disclosure relates to vehicle seats and, more specifically, to vehicle seats equipped with rear facing displays.

BACKGROUND

Modern vehicle interiors may include entertainment systems designed to provide second or third row passengers something to pay attention to during travel, especially toward relatively distant destinations. Such entertainment systems typically include a display screen. The display screen can be a fold-down display coupled with the ceiling of the passenger cabin, in which case the viewing angle may be adjustable to the viewer's preference. Since the display screen is mounted in a fixed location relative to the viewer's seat, additional adjustment of the viewing angle is typically unnecessary.

Seat-mounted display screens pose a special problem for viewers. Namely, the viewing angle changes any time the occupant of the seat to which the display screen is attached decides to adjust the recline angle of the seat. For instance, a display screen affixed to the back of a headrest may have its viewing angle entirely determined by the user of the headrest rather than the viewer of the display who is seated behind the headrest.

U.S. Pat. No. 7,857,176 to Schedivy attempts to address this problem by providing a screen with a manually adjustable viewing angle that includes use of a somewhat clunky system of brackets, wedges, and propping posts. The Schedivy system is not very user-friendly, particularly to the preferred viewers of such video displays, which are often children.

SUMMARY

In accordance with one or more embodiments, a vehicle seat includes a seat back and a display attached to the seat back for movement about a pivot axis. The vehicle seat is configured to self-maintain a desired viewing angle of the display when a recline angle of the seat back changes.

In various embodiments, the vehicle seat includes a lock that engages to prevent movement of the display about the pivot axis and disengages to permit movement of the display about the pivot axis.

In various embodiments, movement of the display about the pivot axis when a lock is disengaged is rotational movement.

In various embodiments, the vehicle seat includes a damper that limits a speed of rotational movement of the display.

In various embodiments, the lock is electromagnetic.

In various embodiments, the lock includes a clutch configured to permit manual adjustment of the viewing angle when the lock is engaged.

In various embodiments, the vehicle seat is configured to detect a change in the recline angle and to change an angle defined between the seat back and the display in response to the detected change in recline angle to maintain the desired viewing angle.

In various embodiments, the vehicle seat includes a gyroscope that detects the change in the recline angle.

In various embodiments, the vehicle seat includes an inclinometer that detects the change in the recline angle.

In various embodiments, the vehicle seat includes a vision system that detects the change in the recline angle.

In various embodiments, the vehicle seat includes a lock that is engaged to prevent movement of the display about the pivot axis when the display is at the desired viewing angle. The lock is configured to disengage in response to the detected change in recline angle and to reengage when the desired viewing angle is reestablished.

In various embodiments, the vehicle seat includes a motor configured to change an angle of the display with respect to the seat to maintain the desired viewing angle.

In various embodiments, the vehicle seat includes a motorized recliner operable to change the recline angle of the seat back. A motor configured to change an angle of the display with respect to the seat is also configured for coordinated movement of the display and the seat back such that the desired viewing angle is maintained throughout the change in the recline angle.

In various embodiments, the desired viewing angle is user changeable.

In various embodiments, the desired viewing angle is determined by a vision system.

Various aspects, embodiments, examples, features and alternatives set forth in the preceding paragraphs, in the claims, and/or in the following description and drawings may be taken independently or in any combination thereof. For example, features disclosed in connection with one embodiment are applicable to all embodiments in the absence of incompatibility of features.

BRIEF DESCRIPTION OF THE DRAWINGS

Exemplary embodiments will hereinafter be described in conjunction with the appended drawings, wherein like designations denote like elements, and wherein:

FIG. 1 is a side view of a portion of a vehicle seat equipped with a self-adjusting display;

FIG. 2 is the side view of FIG. 1 illustrating a display with an offset center of gravity;

FIG. 3 is the side view of FIG. 2 illustrating the center of gravity offset in an opposite direction;

FIG. 9 is a schematic side view of the vehicle seat with coordinated motorized movement of the seat back and display; and FIG. 10 is the side view of FIG. 9 with the seat back at a changed recline angle.

DETAILED DESCRIPTION

Figure 4:
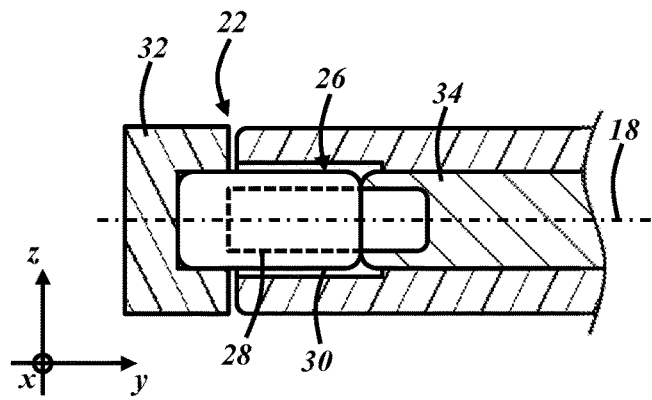
FIG. 4 is a schematic cross-sectional view of the pivot joint of FIG. 1, illustrating a damper along the pivot axis.

Described below is a vehicle seat equipped with a seat-mounted display that self-adjusts to maintain a desired viewing angle without any required intervention from a user.

FIG. 1 is a schematic side view of a portion of a vehicle seat 10 equipped with a self-adjusting display 12. The display 12 is attached to the back side of a headrest portion 14 of a reclinable seat back 16 and is mounted for rotation about a pivot axis 18. Headrest 14 or other portion of the seat back may be constructed with a recess to accommodate at least a portion of the display 12. The seat 10 may include other non-illustrated components, such as a seat bottom, a recliner mechanism that permits the seat back 16 to rotate about a horizontal axis with respect to the seat bottom, mounting rails, and various other adjustment mechanisms (height, tilt, etc.). The vehicle seat 10 is configured to self-maintain a desired viewing angle of the display 12 when a recline angle of the seat back 16 changes. The viewing angle of the display 12 and the recline angle of the seat back 16 are illustrated here with respect to a reference plane extending in the transverse (y) and vertical (z) directions. The transverse direction (y) extends left-to-right with respect to an occupant of the seat 10, and a longitudinal direction (x) extends forward and rearward with respect to the seat occupant. Any reference plane can be used for relative changes in display 12 or seat back 16 orientation.

In FIG. 1, the seat back 16 is illustrated at a first recline angle R1 (shown in phantom view) and a different second recline angle R2. The desired viewing angle here is zero— i.e., a viewing face 20 of the display 12 is aligned with a yz-plane. As illustrated, the desired viewing angle is self-maintained by the seat 10 when the recline angle changes from one angle to another. Stated differently, an angle of the face 20 of the display 12 with respect to the seat back 16 changes by the same amount as the recline angle whenever the recline angle changes. A forward-facing viewer of the display 12 in a seat or rows of seats positioned behind the display-equipped seat 10 in a vehicle cabin thus does not have to adjust the viewing angle of the display even when the occupant of the seat 10 changes the recline angle of the seat back 16.

In the example of FIG. 1, movement of the display 12 about the pivot axis 18 is gravity powered rotational or swiveling movement. The display 12 is affixed to the seat back 16 via a pivot joint 22 (e.g., a hinge) and has a single rotational degree of freedom about the pivot axis 18, which is a transverse horizontal axis in this case. The center of gravity (G) of the display self-aligns directly beneath the pivot axis 18 to maintain the desired viewing angle. The default viewing angle can be different from zero by constructing the display 12 with a center of gravity that is offset in the x-direction with respect to a midplane of the display. In some embodiments, the desired viewing angle can be changed by shifting the center of gravity of the display forward or rearward as shown in FIGS. 2 and 3.

In FIG. 2, the display 12 has a moveable mass 24 that can effectively change the center of gravity of the display and thereby change the desired viewing angle. In FIG. 2, the mass 24 is in a first position which shifts the center of gravity of the display 12 toward the seat back 16, thereby causing the equilibrium orientation of the display to tilt the face 20 of the display slightly upward, which may be suitable for a relatively tall viewer. In FIG. 3, the mass 24 is in a second position which shifts the center of gravity of the display 12 away from the seat back 16, thereby causing the equilibrium orientation of the display to tilt the face of the display slightly downward, which may be suitable for a relatively short viewer. The mass 24 can be shifted between the first and second positions to achieve a vertically oriented display face. The desired viewing angle is thus user changeable. In this case, the mass 24 is located at the bottom of the display 12 and is configured to rotate about a transverse axis to change the center of gravity of the display. A detent mechanism or high-friction pivot joint can be used to hold the mass 24 in the desired position. Other types of mass-shifting are possible, and the desired viewing angle can be user changeable in other ways as discussed further below.

In some embodiments, the vehicle seat 10 includes a damper that limits the rotational speed of the display 12 about the pivot axis 18 during rotational movement. FIG. 4 is a cross-sectional view of the pivot joint 22 of FIG. 1 illustrating a barrel torque damper 26 as one example. The damper 26 has concentric inner and outer portions 28, 30 that are configured to rotate relative to each other and may have a damping fluid (e.g., oil or air) encased between them. Flow restrictors (e.g., fins or orifices) within the damper 26 limit volumetric flow of the fluid and thereby limit the relative speed of rotation between the inner and outer cylinders. In this example, the outer cylinder 30 of the damper 26 is keyed to a mounting bracket 32 of the display, and the inner cylinder 28 is keyed to a hinge pin 34. The bracket 32 is stationary with respect to the seat back 16, and the hinge pin 34 is stationary with respect to the display.

The damper 26 allows the display 12 to reestablish the desired viewing angle when the recline angle of the seat back changes but lessens or prevents movement of the display about the pivot axis during vehicle acceleration and deceleration and when the vehicle experiences other sudden but short duration accelerations (e.g., on rough terrain). The damper 26 may be specified based on the size of the display (e.g., weight and height) and the desired damping rate or maximum permissible rotational speed about the pivot axis. In a non-limiting example, the damper 26 has a torque rating between 4 N-cm and 10 N-cm (0.35-0.9 in-lbs) and a maximum rotational speed between 5 and 20 rpm. In some embodiments the amount of damping is adjustable. Where employed, the damper 26 preferably limits rotational speed in both rotational directions about the pivot axis 18. Other damping arrangements are possible.

Figure 5:
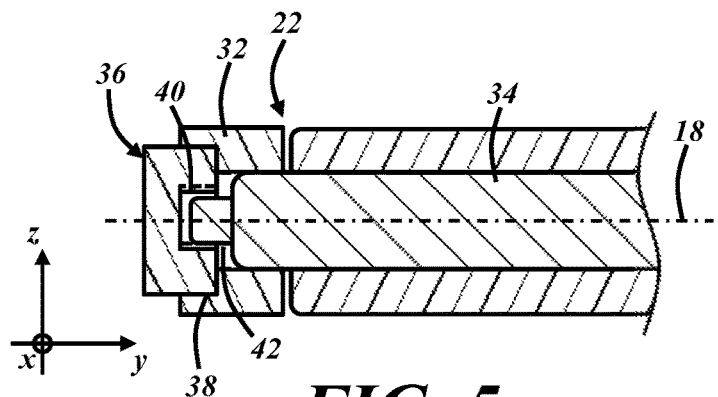
FIG. 5 is a schematic cross-sectional view of the pivot joint illustrated with a manual lock at an end of the hinge pin.

In some embodiments, the self-adjusting feature can be effectively overridden or turned off. FIG. 5 illustrates another example of the pivot joint 22 equipped with a manual lock 36. In this non-limiting example, the lock 36 has a cylindrical outer surface 38 concentric with the pivot axis 18 and an eccentric bore 40. The outer surface 38 can rotate (e.g., via threads) within a bore of the bracket 32, and the bore 40 of the lock 36 is sized larger than an end 42 of the hinge pin 34. In the illustrated angular position of the lock 36, the end 42 of the hinge pin 34 does not touch the eccentric bore 40 such that rotational movement of the hinge pin 34 and display is not impeded. When the lock 36 is rotated about the pivot axis 18 the eccentric bore 40 (shown in dashed lines in FIG. 5) comes into contact with and presses against the end 42 of the pin 34 to prevent rotational movement. A user can thus manually set the desired viewing angle by using the lock 36 to override the self-adjusting feature of the display 12. Other types of locks are possible. In some embodiment, a damper is included at one end of the hinge pin 34 and a lock 36 is included at the opposite end of the hinge pin.

In some embodiments, the seat 10 is equipped with a powered lock that engages to prevent movement of the display 12 about the pivot axis 18 and disengages to permit movement of the display about the pivot axis. Such a powered lock may be electromagnetic with either a rotating portion of the display or a component that is static relative to the seat back being magnetic when power is applied to the electromagnet and non-magnetic when no power is applied to the electromagnet. As one example, the manual lock 36 of FIG. 5 could be omitted and the bracket 32 and pin 34 made from ferromagnetic materials. Multiple electrically conductive windings could be wrapped around or provided as a layer in the bracket 32 to be selectively powered to make the bracket an electromagnetic lock that would prevent rotation of the pin 34 within the bracket when engaged.

Figure 6:
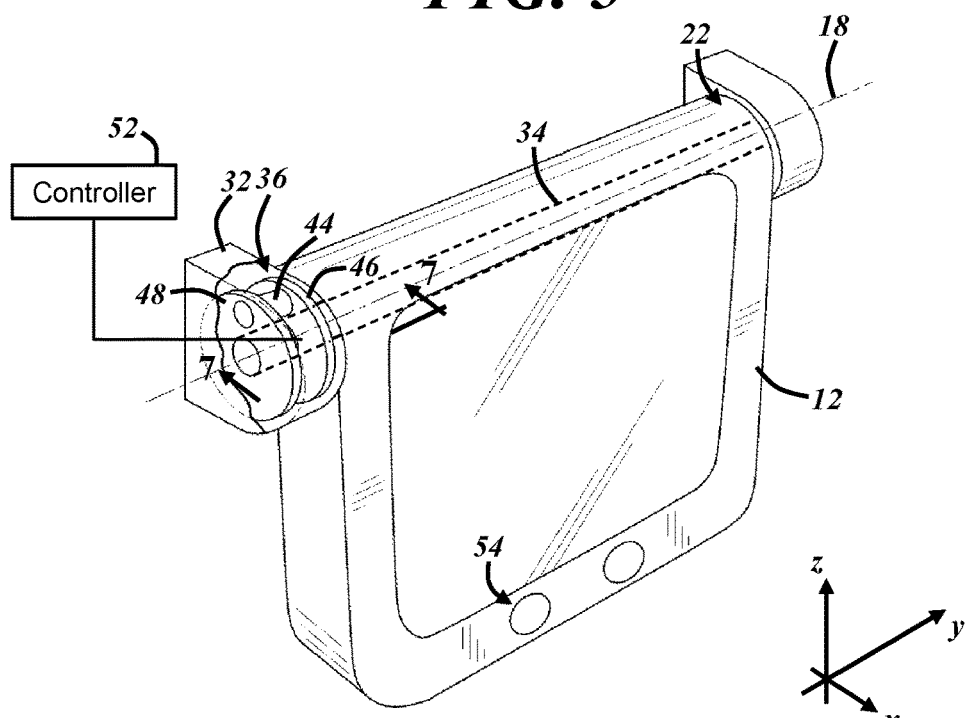
FIG. 6 is a perspective view of the self-adjusting display equipped with an electromagnetic lock.

In some embodiments, the seat 10 is equipped with a powered lock and is also configured to detect a change in the recline angle of the seat back 16. When such a change is detected, the lock is disengaged to allow the display 12 to rotate about the pivot axis 18. Once the desired viewing angle is established or reestablished, the lock reengages to hold the display at the desired viewing angle again. In the example of FIG. 6, the display 12 is attached to the seat back for movement about the pivot axis 18 by brackets 32 that are stationary with respect to the seat back. The brackets 32 and hinge pin 34 together define the pivot joint 22. An electromagnetic lock 36 includes an electromagnet 44 and a ferromagnetic plate 46. In this particular example, the electromagnet 44 is mounted on a printed circuit board (PCB) 48 fixed to the hinge pin 34 to rotate therewith, and the plate 46 is mounted to the stationary bracket 32 in a fixed position. When the electromagnet 44 is powered, the lock 36 is engaged and the display 12 is in a locked condition in which movement of the display about the pivot axis 18 is prevented. When the electromagnet 44 is not powered, the lock 36 is disengaged and the display 12 is in an unlocked condition in which movement of the display about the pivot axis 18 is permitted.

Figure 7:
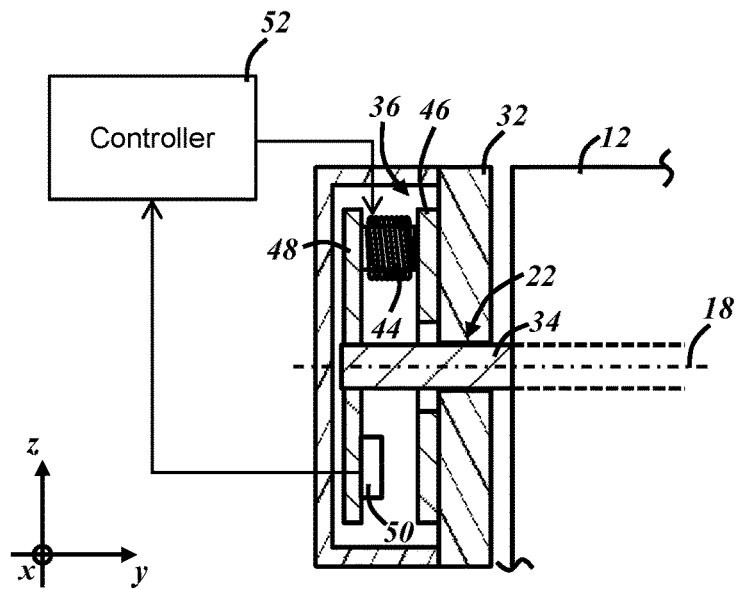
FIG. 7 is a cross-sectional view of the electromagnetic lock of FIG. 6, further illustrating a sensor for detecting a change in recline angle.

With additional reference to FIG. 7, a sensor 50 is configured to detect a change in the recline angle of the seat back. In this example, the sensor 50 is mounted to the PCB 48. The sensor 50 may include an inclinometer or tilt sensor that detects the angle of whatever component it is mounted to with respect to a reference plane, such as the horizon. The tilt sensor may be or may include an accelerometer, an electrolytic tilt sensor, or a liquid capacitive tilt sensor, for example. The sensor 50 may also be or may include a gyroscope, which is less sensitive to stray vibrations or quick sudden movements than other inclinometers and therefore advantageous in a moving vehicle.

The lock and sensor mechanism of FIGS. 6 and 7 can be used with the example of FIG. 1 as follows. In the simple case where the desired viewing angle is zero, the electromagnetic lock 36 is engaged to lock the display 12 at that viewing angle. When the occupant of the seat 10 changes the angle of the seat back 16, the sensor 50 detects the change at some threshold value (e.g., 1 degree). When the change is detected, the applied voltage is removed from the electromagnet 44, and the display 12 is free to rotate about the pivot axis 18. The rotational movement may be damped as discussed in conjunction with FIG. 4 or by other suitable means. When the same sensor 50 determines that the desired viewing angle has been reestablished, the electromagnet 44 is powered and the lock 36 is reengaged to lock the display 12 at the desired viewing angle. In some examples, the sensor 50 is mounted to the seat back 16 or along a recliner mechanism, and the lock 36 is disengaged when a change in the recline angle is detected. A separate sensor that rotates with the display 12 can then be used to determine when the desired viewing angle is reestablished.

A controller 52 may be included to receive information regarding the seat back recline angle and the display viewing angle, to process that information, and to control the lock 36 accordingly. The controller 52 may for example receive information pertinent to a change in the recline angle of the seat back 16 and cut power to the electromagnet 44 in response. Then, the controller 52 may receive information pertinent to the viewing angle of the display 12 and, when the viewing angle is the desired viewing angle, power the electromagnet 44 in response to lock the display in place relative to the seat back. In this case, the information pertinent to the change in recline angle and the information pertinent to the viewing angle are both received from the same sensor 50, but separate sensors could be used. The controller 52 can be mounted to the PCB 48, can be built into the display 12 or the seat 10, or can be provided by or shared with some other vehicle component or system.

In some embodiments, the seat 10 includes a user interface 54 as shown for example in FIG. 6. In this example, the user interface 54 is part of the display 12 and includes buttons or touch areas configured to detect a user's intention to interact with the self-adjusting display 12. The user interface 54 provides information to the controller 52 and in some cases communicates information to the user. Exemplary user inputs may include an instruction to disengage and/or reengage the lock 36, or disabling the self-adjustment feature so that the user can adjust the viewing angle manually without the lock disengaging in an attempt to reestablish the desired viewing angle. The user interface 54 may also be configured to permit a user to change the desired viewing angle by inputting a new desired viewing angle or by the user manually moving the display to a new viewing angle and instructing the system to establish the new viewing angle as the desired viewing angle.

In some embodiments, the lock 36 includes a clutch configured to permit manual adjustment of the viewing angle when the lock is engaged. In this case, the electromagnetic lock 36 may double as a clutch via configuration of the strength of the electromagnetic 44 so that the lock is sufficiently strong to prevent rotation of the display about the pivot axis during normal driving and acceleration but sufficiently weak to allow the electromagnet 44 to slide along the plate 46 when a user wishes to manually adjust the viewing angle to a new desired viewing angle. A layer of material (e.g., plastic) may be interposed between the electromagnet 44 and the plate 46 to facilitate its use as a clutch.

In another embodiment, the vehicle seat 10 is configured to detect a change in the recline angle and to change an angle defined between the seat back 16 and the display 12 in response to the detected change in recline angle to maintain the desired viewing angle. In the above examples, the change in angle between the display 12 and seat back 16 is effected via gravity and the mass of the display moving the display to an equilibrium position. In other examples, movement of the display about the pivot axis is motorized movement under the control of the controller 52. For example, the electromagnetic lock 36 of FIGS. 6 and 7 can be replaced with a motor with its shaft fixed to the hinge pin 34 either directly or via a transmission. The sensor 50 can be an inclinometer and/or a gyroscope built into the display 12. When the controller 50 receives information indicating an amount of change in recline angle, the motor turns the hinge pan 34 and display 12 to increase the angle between the display and the seat back by the same amount. The motor acts as the lock 36 in that case, both moving display to the desired viewing angle, and then holding the display at the desired viewing angle.

Figure 8:
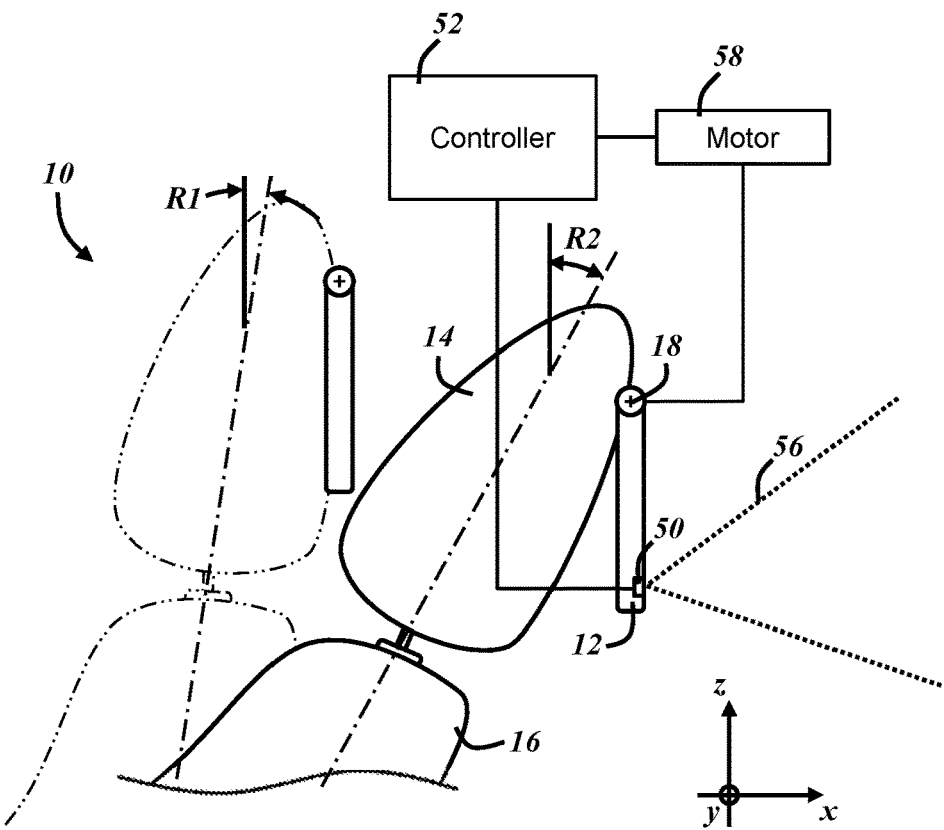
FIG. 8 is a side view of a portion of the vehicle seat of FIG. 1 equipped with a camera and motorized display adjustment.

In another embodiment, the sensor 50 is provided by a vision system. In the example of FIG. 8, the sensor 50 is a camera mounted on the display 12. The camera provides imaging data to a controller 52 for analysis, including determination if a human face is present within a field of view 56 of the camera and, if so, the position of the human face within the field of view. If necessary, the controller 52 then controls a motor 58 to move the display 12 about the pivot axis 18 until the position of the human face within the field of view 56 correlates to the desired viewing angle. In the illustrated example, as the seat back 16 reclines from the first position (in phantom view) to the second position, the position of the face of the viewer begins to move toward the top of the field of view 56 of the camera 50. The controller 52 recognizes this change and compensates by rotating the display 12 about the pivot axis 18 to maintain the position of the face of the viewer in the field of view 56 so that the desired viewing angle is maintained. The motor 58 rotates the display about the pivot axis 18 in a rotational direction that is opposite of the rotational direction of the seat back 16 about a recliner axis.

In this particular example, the display 12 is self-adjusting to the desired viewing angle even when the occupant of the seat does not change the recline angle of the seat—e.g., when the display viewer changes from a relative short viewer to a relatively tall viewer, the desired viewing angle changes as well, and the display 12 is moved to that viewing angle.

In another motorized embodiment illustrated schematically in FIGS. 9 and 10, movement of the display 12 about the pivot axis 18 and movement of the seat back 16 about a recliner axis 60 is coordinated movement. A controller 52 receives information pertinent to the recline angle of the seat back 16 from a recliner motor 62 or an encoder associated with the recliner motor. When the recliner motor 62 is powered and the recline angle changes from the first recline angle of FIG. 9 to the second recline angle of FIG. 10, the controller 52 controls a motor 58 housed in the mounting bracket of the display to rotate the display 12 about the pivot axis 18 by the same amount in an opposite rotational direction. In this manner, the desired viewing angle is maintained throughout the movement of the seat back 16. In some embodiments, the controller 52 can be omitted and the two motors 58, 62 can be powered together to move the seat back 16 and display 12 in opposite rotational directions at the same rotational speed. In such cases, the display 12 may be manually adjustable about the display hinge pin or motor shaft so that a user can change the desired viewing angle, after which any change in recline angle is compensated for by a change in the angle between the display 12 and the seat back 16 to maintain the desired viewing angle.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A vehicle seat, comprising:
   a seat back;
   a display attached to the seat back for movement about a pivot axis; and
   a lock that engages to prevent movement of the display about the pivot axis and disengages to permit movement of the display about the pivot axis,
   wherein the vehicle seat is configured to self-maintain a desired viewing angle of the display when a recline angle of the seat back changes.

2. The vehicle seat of claim 1, wherein the movement of the display about the pivot axis when the lock is disengaged is rotational movement.

3. The vehicle seat of claim 1, further comprising a damper that limits a speed of the movement about the pivot axis.

4. The vehicle seat of claim 1, wherein the lock is electromagnetic.

5. The vehicle seat of claim 1, wherein the lock comprises a clutch configured to permit manual adjustment of the viewing angle when the lock is engaged.

6. The vehicle seat of claim 1, wherein the vehicle seat is configured to detect a change in the recline angle and to change an angle defined between the seat back and the display in response to the detected change in recline angle to maintain the desired viewing angle.

7. The vehicle seat of claim 6, wherein the lock is configured to disengage in response to the detected change in recline angle and to reengage when the desired viewing angle is reestablished.

8. The vehicle seat of claim 1, further comprising a gyroscope that detects a change in the recline angle.

9. The vehicle seat of claim 1, further comprising an inclinometer that detects a change in the recline angle.

10. The vehicle seat of claim 1, further comprising a vision system that detects a change in the recline angle.

11. The vehicle seat of claim 1, further comprising a motor configured to change an angle of the display with respect to the seat to maintain the desired viewing angle.

12. The vehicle seat of claim 11, wherein the vehicle seat includes a motorized recliner operable to change the recline angle of the seat back, the motor being configured for coordinated movement of the display and the seat back such that the desired viewing angle is maintained throughout the change in the recline angle.

13. The vehicle seat of claim 1, wherein the desired viewing angle is user determinable.

14. The vehicle seat of claim 1, wherein the desired viewing angle is determined by a vision system.

15. A vehicle seat, comprising:
   a seat back;
   a display attached to the seat back for movement about a pivot axis, wherein the vehicle seat is configured to self-maintain a desired viewing angle of the display when a recline angle of the seat back changes; and
   a lock that is engaged to prevent movement of the display about the pivot axis when the display is at the desired viewing angle,
   wherein the vehicle seat is configured to detect a change in the recline angle and to change an angle defined between the seat back and the display in response to the detected change in recline angle to maintain the desired viewing angle, and wherein the lock is configured to disengage in response to the detected change in recline angle and to reengage when the desired viewing angle is reestablished.

16. The vehicle seat of claim 15, wherein the lock is electromagnetic.

17. The vehicle seat of claim 15, wherein the lock comprises a clutch configured to permit manual adjustment of the viewing angle when the lock is engaged.

18. The vehicle seat of claim 15, further comprising a gyroscope that detects the change in the recline angle.

19. The vehicle seat of claim 15, further comprising an inclinometer that detects the change in the recline angle.

20. The vehicle seat of claim 15, further comprising a vision system that detects the change in the recline angle.

* * * * *